(12) United States Patent
Liang et al.

(10) Patent No.: US 11,069,675 B2
(45) Date of Patent: Jul. 20, 2021

(54) ESD PROTECTION DEVICE WITH BIDIRECTIONAL DIODE STRING-TRIGGERING SCR STRUCTURE

(71) Applicant: JIANGNAN UNIVERSITY, Jiangsu (CN)

(72) Inventors: Hailian Liang, Jiangsu (CN); Qiang Xu, Jiangsu (CN); Xiaofeng Gu, Jiangsu (CN)

(73) Assignee: JIANGNAN UNIVERSITY, Wuxi (CN)

( * ) Notice: Subject to any disclaimer, the term of this patent is extended or adjusted under 35 U.S.C. 154(b) by 8 days.

(21) Appl. No.: 16/618,694

(22) PCT Filed: May 17, 2018

(86) PCT No.: PCT/CN2018/087305
§ 371 (c)(1),
(2) Date: Dec. 2, 2019

(87) PCT Pub. No.: WO2019/218304
PCT Pub. Date: Nov. 21, 2019

(65) Prior Publication Data
US 2020/0091138 A1 Mar. 19, 2020

(51) Int. Cl.
*H01L 27/02* (2006.01)
(52) U.S. Cl.
CPC ...... *H01L 27/0262* (2013.01); *H01L 27/0292* (2013.01)

(58) Field of Classification Search
CPC ............. H01L 27/0262; H01L 27/0292; H01L 27/0255; H01L 23/60; H01L 29/74; H01L 27/02
See application file for complete search history.

(56) References Cited

U.S. PATENT DOCUMENTS 5,986,307 A * 11/1999 Yu ....................... H01L 27/0259
257/355
2006/0197110 A1* 9/2006 Sugahara ........ H01L 21/823892
257/203
(Continued)

FOREIGN PATENT DOCUMENTS

| CN | 101816069 A | 8/2010 |
|---|---|---|
| CN | 102054861 A | 5/2011 |

(Continued)

*Primary Examiner* — Bitew A Dinke
(74) *Attorney, Agent, or Firm* — Muncy, Geissler, Olds and Lowe, P.C.

(57) ABSTRACT

An ESD protection device for bidirectional diode string triggering SCR structure belongs to the field of electro-static discharge of an integrated circuit. A deep N well is arranged on a P substrate, and a first P well, a first N well, a second P well and a second N well are successively arranged from left to right on a surface region of the deep N well. In a second N well region, a mask preparing plate is used to insert the P wells at intervals. The circumference of each P well is isolated by the N well. Each P well is respectively provided with a pair of P+ implantation region and N+ implantation region. The metal wire is connected with the implantation region, and a positive electrode and a negative electrode are led out from the metal wire for forward conduction and reverse conduction.

2 Claims, 4 Drawing Sheets

(56) References Cited

U.S. PATENT DOCUMENTS

| | | | |
|---|---|---|---|
| 2009/0213506 A1* | 8/2009 | Zhan | H01L 27/0262 |
| | | | 361/56 |
| 2011/0049631 A1* | 3/2011 | Itaka | H01L 21/823892 |
| | | | 257/351 |
| 2011/0186909 A1* | 8/2011 | Tsai | H01L 29/73 |
| | | | 257/173 |
| 2012/0043583 A1* | 2/2012 | Abou-Khalil | H01L 29/7412 |
| | | | 257/157 |
| 2013/0208385 A1* | 8/2013 | Salcedo | H01L 23/60 |
| | | | 361/111 |
| 2014/0177312 A1* | 6/2014 | Shibata | G11C 11/417 |
| | | | 365/72 |
| 2014/0191328 A1* | 7/2014 | Tsuruta | H01L 21/823878 |
| | | | 257/371 |
| 2018/0096986 A1 | 4/2018 | Oh | |
| 2019/0006364 A1* | 1/2019 | Sakamoto | H01L 27/0259 |
| 2020/0006474 A1* | 1/2020 | Taghizadeh Kaschani | |
| | | | H01L 29/0623 |

FOREIGN PATENT DOCUMENTS

| | | | |
|---|---|---|---|
| CN | 103606548 A | | 2/2014 |
| CN | 105405844 A | * | 3/2016 |
| CN | 105633074 A | | 6/2016 |
| CN | 108695316 A | | 10/2018 |

* cited by examiner

US 11,069,675 B2

ESD PROTECTION DEVICE WITH BIDIRECTIONAL DIODE STRING-TRIGGERING SCR STRUCTURE

TECHNICAL FIELD

The present invention belongs to the field of electro-static discharge (ESD) protection of integrated circuits, and particularly relates to an ESD protection device for bidirectional diode string triggering SCR structure, which can be used for enhancing the ESD protection reliability of an on-chip IC.

BACKGROUND

With the wide application of an integrated circuit (IC) and the decrease of feature size of an integrated manufacturing process, the operating voltage of IC products is gradually reduced, and the ESD protection of on-chip IC faces great challenge. Especially with the rapid development of radio-frequency circuits, the ESD protection of low-voltage and radio-frequency IC proposes severe ESD protection requirements for ESD protection design work of the on-chip IC in the aspects of low trigger voltage, small parasitic capacitance and strong ESD robustness. Traditional ESD protection solutions of MOS tubes and diodes are difficult to adapt to the current development trend of ESD protection for electronic products, especially radio frequency IC due to the factors of large parasitic capacitance or high trigger voltage.

The existing ESD protection solution of diode triggering SCR has the problems of inconvenient adjustment of trigger voltage, large layout area, low ESD robustness per unit area and one-way protection of ESD pulse, and is limited to a certain degree in actual electronic engineering, especially the ESD protection application of radio frequency IC. An ESD protection device for bidirectional diode string triggering SCR structure proposed by the present invention can effectively solve the technical problems in the existing ESD protection solution for diode triggering SCR. By using a well splitting technology and the extension design of the vertical layout hierarchy of the device, in combination with a certain metal wiring method, an ESD protection device for bidirectional diode triggering SCR structure with adjustable trigger voltage can be obtained without increasing the layout area of the device.

SUMMARY

In view of the problem in the prior art, the present invention aims to provide an ESD protection device for bidirectional diode string triggering SCR structure.

The technical solution of the present invention is:

An ESD protection device for bidirectional diode string triggering SCR structure is provided. The ESD protection device comprises a diode string formed by a well splitting technique, a bidirectional SCR structure and a metal wire;

the bidirectional SCR structure and the diode string comprise a P substrate, a deep N well, a first P well, a first N well, a second P well, a second N well, a first P+ implantation region, a first N+ implantation region, a second P+ implantation region, a second N+ implantation region, a third P+ implantation region, a third N+ implantation region, a fourth P+ implantation region and a fourth N+ implantation region, wherein the deep N well is arranged on the P substrate, and the first P well, the first N well, the second P well and the second N well are successively arranged from left to right on a surface region of the deep N well; the left edge of the first P well is connected with the left edge of the deep N well; the right side of the first P well is connected with the left side of the first N well; the right side of the first N well is connected with the left side of the second P well; the right edge of the second P well is connected with the left side of the second N well; the right edge of the second N well is connected with the right edge of the deep N well; the first P+ implantation region and the first N+ implantation region are successively arranged from left to right on the surface region of the first P well; the second P+ implantation region and the second N+ implantation region are successively arranged from left to right on the surface region of the first N well; the third P+ implantation region and the third N+ implantation region are successively arranged from left to right on the surface region of the second P well; the fourth P+ implantation region and the fourth N+ implantation region are successively arranged from left to right on the surface region of the second N well;

in the second N well region, a mask preparing plate is used to insert the P wells at intervals; the circumference of each P well is isolated by the N well; different quantities of diodes are prepared to form the diode string; the diode string assists a departure path to effectively suppress the Darlington effect; the surface region of each P well is respectively provided with a pair of P+ implantation region and N+ implantation region; trigger voltage is controlled by increasing or decreasing the number of diodes formed by well splitting to ensure the application of the ESD protection device in a low voltage field;

the metal wire is used to connect the implantation region, and lead out two electrodes from the metal wire respectively as the forward conduction and reverse conduction of the protection device, to ensure that a diode formed by well splitting assists a trigger path in conducting, thereby reducing the trigger voltage and turn-on time of the device.

when the ESD protection device is a bidirectional three-diode triggering SCR structure, in the second N well region, along the Z-axis direction of the ESD protection device, the third P well, the third N well, the fourth P well, the fourth N well, the fifth P well, the fifth N well and the sixth N well are successively inserted on the right side; the fifth P+ implantation region, the fifth N+ implantation region, the sixth P+ implantation region, the sixth N+ implantation region, the seventh P+ implantation region and the seventh N+ implantation region are respectively inserted into the P well, wherein the lower side of the second N well is connected with the lower side of the deep N well; the upper side of the second N well is connected with the lower side of the third P well; the upper side of the third P well is connected with the lower side of the third N well; the upper side of the third N well is connected with the lower side of the fourth P well; the upper side of the fourth P well is connected with the lower side of the fourth N well; the upper side of the fourth N well is connected with the lower side of the fifth P well; the upper side of the fifth P well is connected with the lower side of the fifth N well; the upper side of the fifth N well is connected with the upper side of the deep N well; the fifth P+ implantation region and the fifth N+ implantation region are successively arranged from bottom to top on the surface region of the third P well; the sixth P+ implantation region and the sixth N+ implantation region are successively arranged from bottom to top on the surface region of the fourth P well; the seventh P+ implantation region and the seventh N+ implantation region are successively arranged from bottom to top on the surface region of the fifth P well;

the first N+ implantation region is connected with first metal; the second P+ implantation region is connected with second metal; the second N+ implantation region is connected with third metal; the third N+ implantation region is connected with fourth metal; the fourth P+ implantation region is connected with fifth metal; the fourth N+ implantation region is connected with sixth metal; the first P+ implantation region is connected with seventh metal; the third P+ implantation region is connected with eighth metal; the fifth P+ implantation region is connected with ninth metal; the fifth N+ implantation region is connected with tenth metal; the sixth P+ implantation region is connected with eleventh metal; the sixth N+ implantation region is connected with twelfth metal; the seventh P+ implantation region is connected with thirteenth metal; the seventh N+ implantation region is connected with fourteenth metal;

the third metal, the sixth metal and the ninth metal are connected with the seventeenth metal; the seventh metal, the eighth metal and the fourteenth metal are connected with the twentieth metal; the tenth metal and the eleventh metal are connected with the eighteenth metal; the twelfth metal and the thirteenth metal are connected with the nineteenth metal;

the first metal and the second metal are connected with the fifteenth metal, and a first electrode is led out from the fifteenth metal, and used as a metal anode of the device—conducted forward or a metal cathode—conducted reversely;

the fourth metal and the fifth metal are connected with the sixteenth metal; a second electrode is led out from the sixteenth metal, and used as a metal cathode of the device—conducted forward or a metal anode—conducted reversely.

When the first electrode is used as the metal anode of the device and the second electrode is used as the metal cathode of the device, the first N+ implantation region and the first P well, the first N well and the second P well, the second N well and the fourth P+ implantation region respectively form reverse bias PN junctions, wherein the reverse bias PN junction formed by the first N well and the second P well is an avalanche breakdown junction of the SCR, and the diode formed by the well splitting assists the trigger path in conducting, thereby reducing the trigger voltage and turn-on time of the device;

when the first electrode is used as the metal cathode of the device and the second electrode is used as the metal anode of the device, the third N+ implantation region and the second P well, the first N well and the second P+ implantation region, the first N well and the first P+ well respectively form reverse bias PN junctions, wherein the reverse bias PN junction formed by the first N well and the first P well is an avalanche breakdown junction of the SCR, and the diode formed by the well splitting assists the trigger path in conducting, thereby reducing the trigger voltage and turn-on time of the device;

when the first electrode is used as the metal anode of the device and the second electrode is used as the metal cathode of the device, the second P+ implantation region, the first N well and the second P well form a parasitic PNP tube T1; the first N well, the second P well and the third N+ implantation region form a parasitic NPN tube T2; the PNP tube T1 and the NPN tube T2 form a current discharge path of the SCR structure;

when the first electrode is used as the metal cathode of the device and the second electrode is used as the metal anode of the device, the fourth P+ implantation region, the second N well, the deep N well, the first N well and the first P well form a parasitic PNP tube T1; the second N well, the deep N well, the first N well, the first P well and the first N+ implantation region form a parasitic NPN tube T2; and the PNP tube T1 and the NPN tube T2 form a current discharge path of the SCR structure.

The present invention has the beneficial effects: the present invention uses the diode string formed by the well splitting technology and the bidirectional SCR structure, and combines a special metal wiring method to flexibly control the trigger voltage and the holding voltage of the device, thereby improving the ESD robustness of the device and realizing bidirectional ESD protection.

Figure 1:
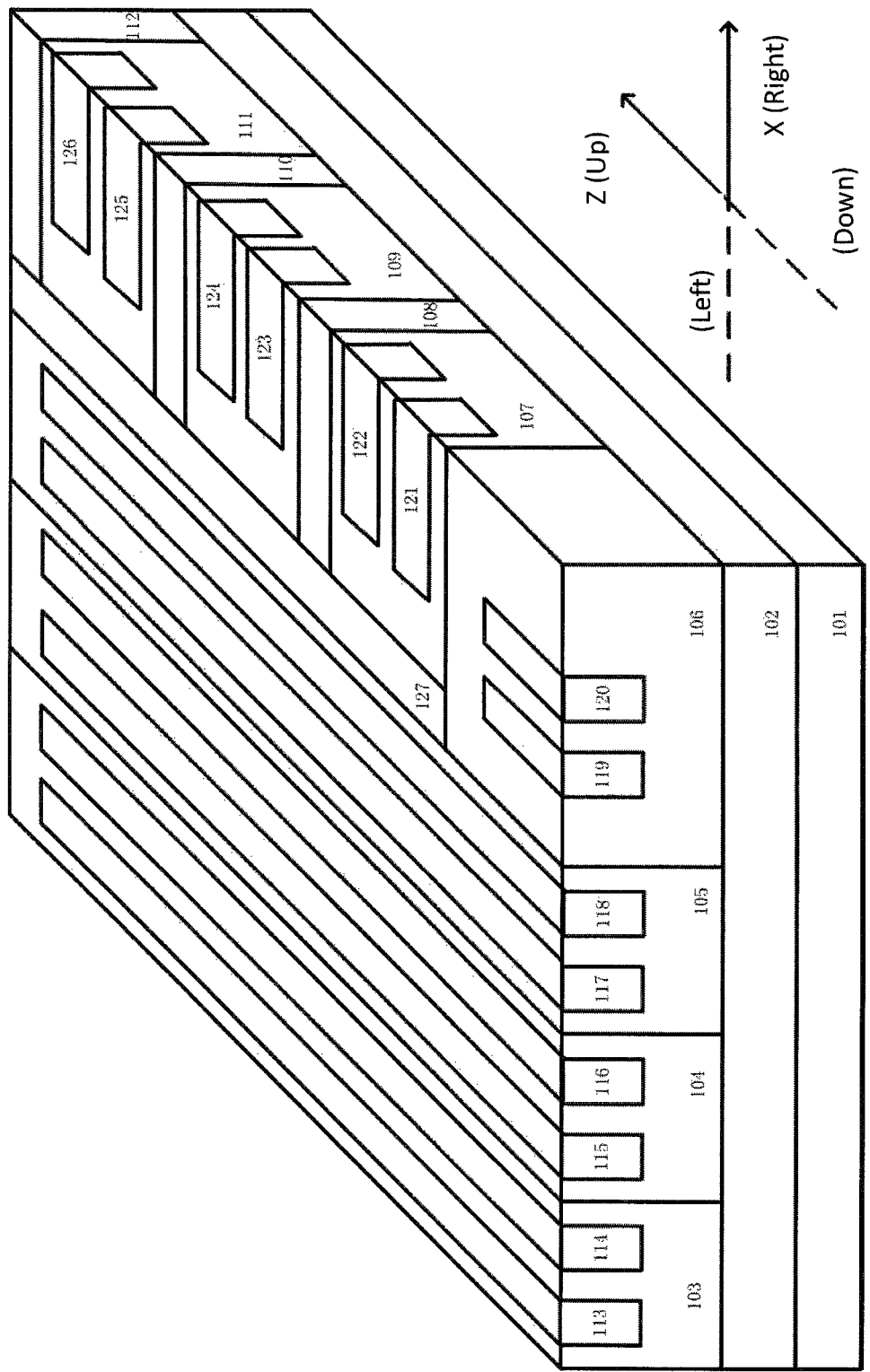
FIG. 1 is a schematic diagram of well splitting of an ESD protection device for bidirectional diode string triggering SCR structure.
Figure 2:
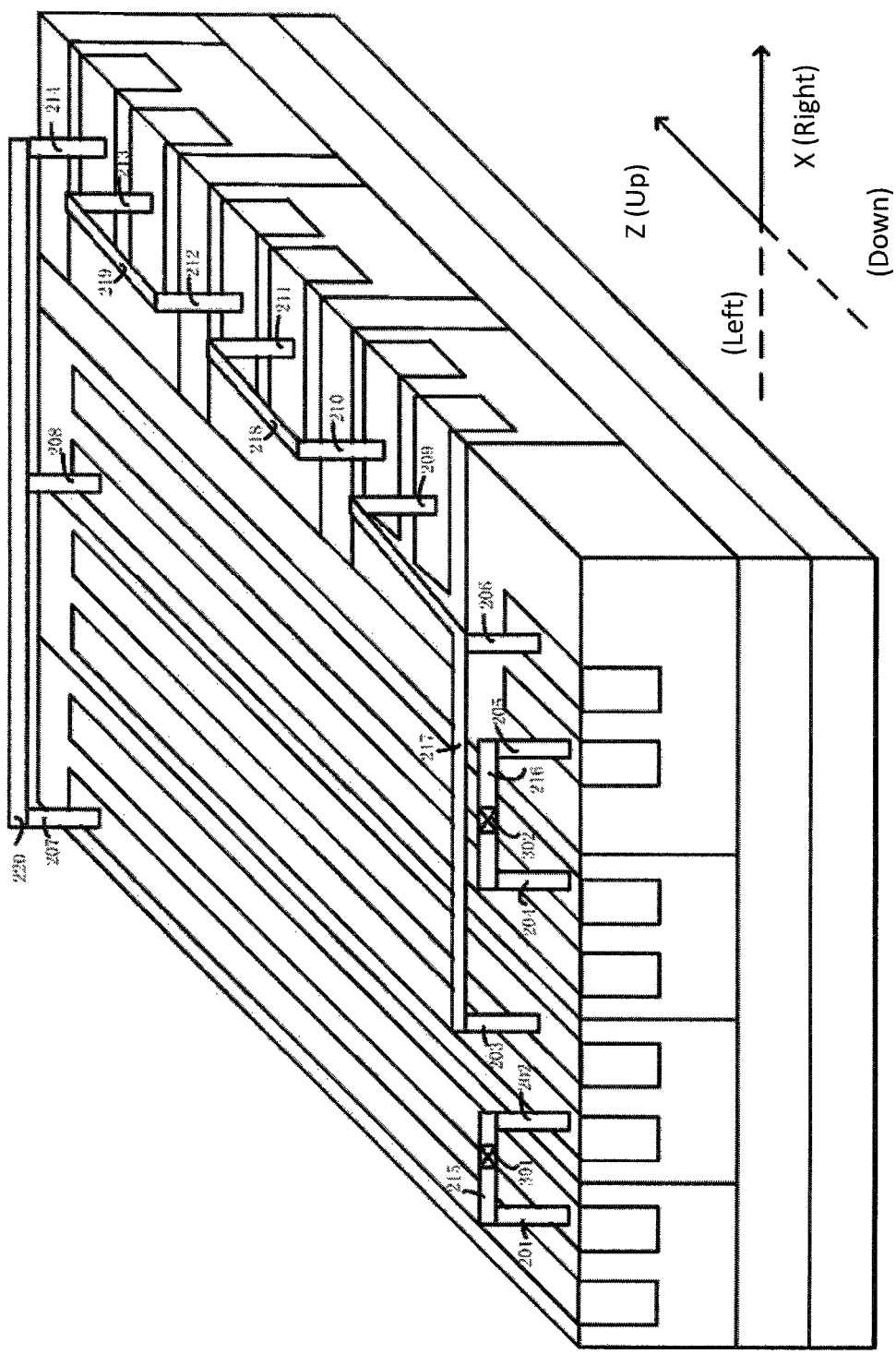
FIG. 2 is a schematic diagram of metal wire connection of an ESD protection device for bidirectional diode string triggering SCR structure.
Figure 3:
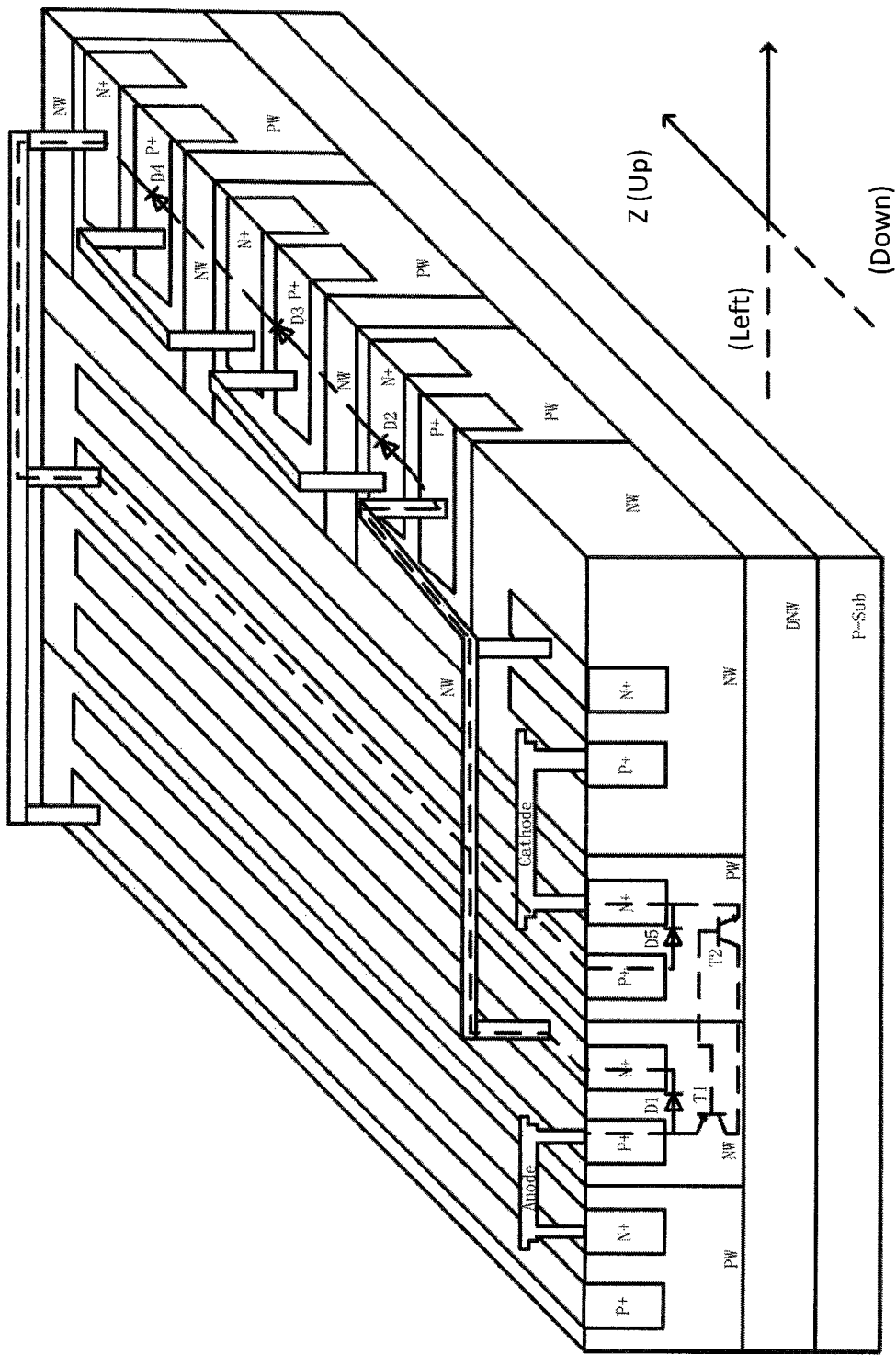
FIG. 3 is a diagram of a current discharge path of an ESD structure when a first electrode is used as a metal anode and a second electrode is used as a metal cathode.
Figure 4:
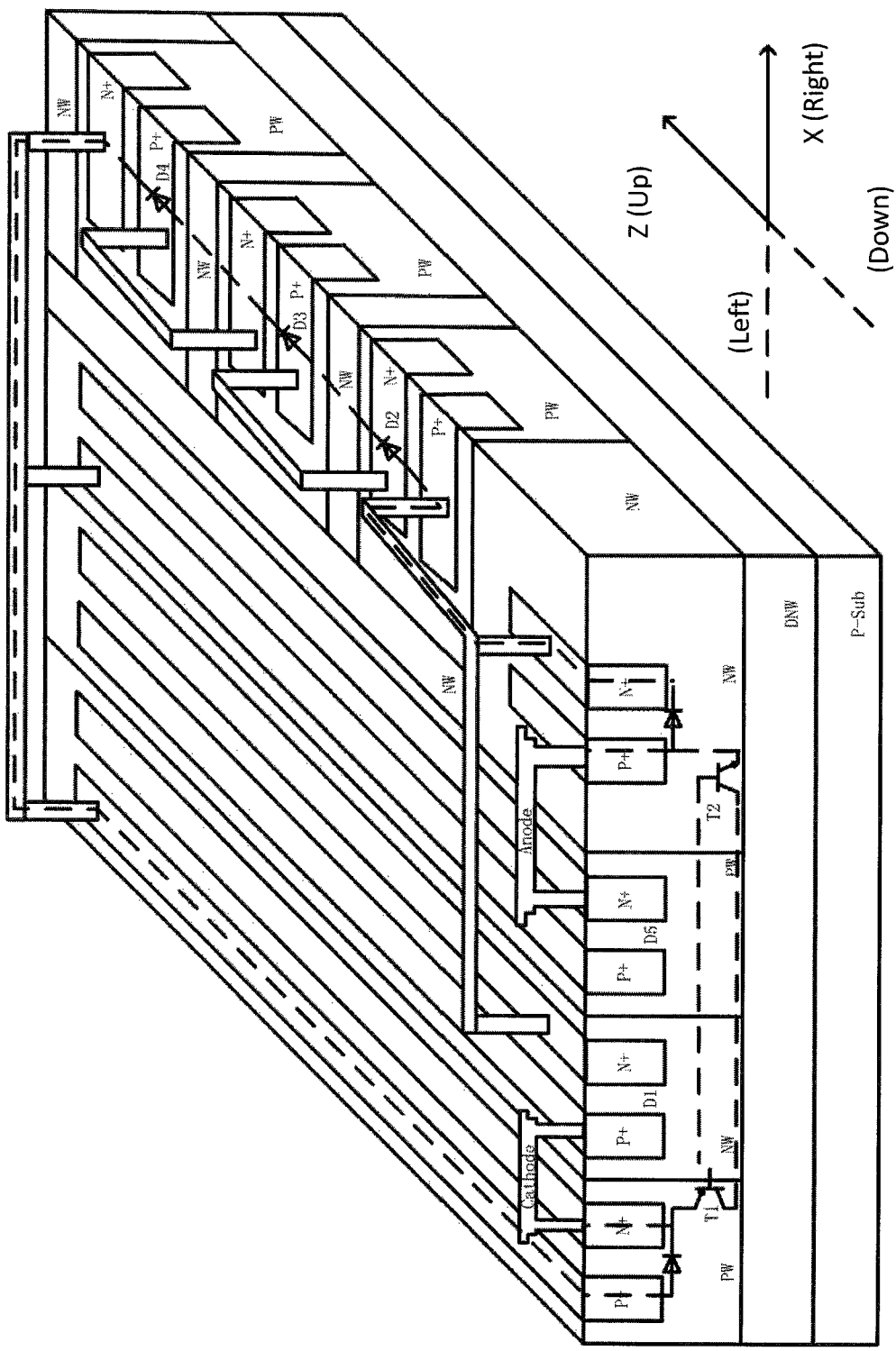
FIG. 4 is a diagram of a current discharge path of an ESD structure when a first electrode is used as a metal cathode and a second electrode is used as a metal anode.

In the figures: 101 P substrate; 102 deep N well; 103 first P well; 104 first N well; 105 second P well; 106 second N well; 107 third P well; 108 third N well; 109 fourth P well; 110 fourth N well; 111 fifth P well; 112 fifth N well; 113 first P+ implantation region; 114 first N+ implantation region; 115 second P+ implantation region; 116 second N+ implantation region; 117 third P+ implantation region; 118 third N+ implantation region; 119 fourth P+ implantation region; 120 fourth N+ implantation region; 121 fifth P+ implantation region; 122 fifth N+ implantation region; 123 sixth P+ implantation region; 124 sixth N+ implantation region; 125 seventh P+ implantation region; 126 seventh N+ implantation region; 127 sixth N well; 201 first metal; 202 second metal; 203 third metal; 204 fourth metal; 205 fifth metal; 206 sixth metal; 207 seventh metal; 208 eighth metal; 209 ninth metal; 210 tenth metal; 211 eleventh metal; 212 twelfth metal; 213 thirteenth metal; 214 fourteenth metal; 215 fifteenth metal; 216 sixteenth metal; 217 seventeenth metal; 218 eighteenth metal; 219 nineteenth metal; 220 twentieth metal; 301 first electrode; and 302 second electrode.

DETAILED DESCRIPTION

Specific embodiments of the present invention are further described below in combination with accompanying drawings and the technical solution.

An ESD protection device for bidirectional diode string triggering SCR structure comprises a diode string formed by a well splitting technology and a bidirectional SCR structure, and combines a special metal wiring method to flexibly control the trigger voltage and the holding voltage of the device, thereby improving the ESD robustness of the device and realizing bidirectional ESD protection. The ESD protection device mainly comprises a bidirectional SCR structure and the diode string which are composed of a P substrate 101, a deep N well 102, a first P well 103, a first N well 104, a second P well 105, a second N well 106, a first P+ implantation region 113, a first N+ implantation region 114, a second P+ implantation region 115, a second N+ implantation region 116, a third P+ implantation region 117, a third N+ implantation region 118, a fourth P+ implantation region 119 and a fourth N+ implantation region 120. The well splitting technology has the main features: in the second N well region 106, a mask preparing plate is used to insert a plurality of P wells at intervals; the circumference of each P well is isolated by the N well; different quantities of diodes are prepared to form the diode string; by taking a diode string composed of three diodes as an example, in the second N well region 106, along the Z-axis direction of the device, the third P well 107, the third N well 108, the fourth P well 109, the fourth N well 110, the fifth P well 111, the fifth N well 112 and the sixth N well 127 are successively inserted on the right side; the fifth P+ implantation region 121, the fifth N+ implantation region 122, the sixth P+ implantation region 123, the sixth N+ implantation region 124, the seventh P+ implantation region 125 and the seventh N+ implantation region 126 are respectively inserted into a plurality of P wells; through specific metal connection, the diode string composed of three diodes can be formed; and finally, by using the metal wiring design method, the ESD protection device for bidirectional diode string triggering SCR structure composed of the diode string and the bidirectional SCR structure can be realized. The preparation method and features can be described in detail through an ESD protection device for bidirectional three-diode triggering SCR structure as an example.

The deep N well 102 is prepared on the P substrate 101, and the first P well 103, the first N well 104, the second P well 105 and the second N well 106 are successively arranged from left to right on a surface region of the deep N well 102; the left edge of the first P well 103 is connected with the left edge of the deep N well 102; the right side of the first P well 103 is connected with the left side of the first N well 104; the right side of the first N well 104 is connected with the left side of the second P well 105; the right edge of the second P well 105 is connected with the left side of the second N well 106; the right edge of the second N well 106 is connected with the right edge of the deep N well 102; the first P+ implantation region 113 and the first N+ implantation region 114 are successively arranged from left to right on the surface region of the first P well 103; the second P+ implantation region 115 and the second N+ implantation region 116 are successively arranged from left to right on the surface region of the first N well 104; the third P+ implantation region 117 and the third N+ implantation region 118 are successively arranged from left to right on the surface region of the second P well 105; the fourth P+ implantation region 119 and the fourth N+ implantation region 120 are successively arranged from left to right on the surface region of the second N well 106;

the third P well 107, the third N well 108, the fourth P well 109, the fourth N well 110, the fifth P well 111, and the fifth N well 112 are successively arranged from bottom to top on the surface region of the second N well 106; the lower side of the second N well 106 is connected with the lower side of the deep N well 102; the upper side of the second N well 106 is connected with the lower side of the third P well 107; the upper side of the third P well 107 is connected with the lower side of the third N well 108; the upper side of the third N well 108 is connected with the lower side of the fourth P well 109; the upper side of the fourth P well 109 is connected with the lower side of the fourth N well 110; the upper side of the fourth N well 110 is connected with the lower side of the fifth P well 111; the upper side of the fifth P well 111 is connected with the lower side of the fifth N well 112; the upper side of the fifth N well 112 is connected with the upper side of the deep N well 102; the fifth P+ implantation region 121 and the fifth N+ implantation region 122 are successively arranged from bottom to top on the surface region of the third P well 107; the sixth P+ implantation region 123 and the sixth N+ implantation region 124 are successively arranged from bottom to top on the surface region of the fourth P well 109; the seventh P+ implantation region 125 and the seventh N+ implantation region 126 are successively arranged from bottom to top on the surface region of the fifth P well 111; the first N+ implantation region 114 is connected with first metal 201; the second P+ implantation region 115 is connected with second metal 202; the second N+ implantation region 116 is connected with third metal 203; the third N+ implantation region 118 is connected with fourth metal 204; the fourth P+ implantation region 119 is connected with fifth metal 205; the fourth N+ implantation region 120 is connected with sixth metal 206; the first P+ implantation region 113 is connected with seventh metal 207; the third P+ implantation region 117 is connected with eighth metal 208; the fifth P+ implantation region 121 is connected with ninth metal 209; the fifth N+ implantation region 122 is connected with tenth metal 210; the sixth P+ implantation region 123 is connected with eleventh metal 211; the sixth N+ implantation region 124 is connected with twelfth metal 212; the seventh P+ implantation region 125 is connected with thirteenth metal 213; the seventh N+ implantation region 126 is connected with fourteenth metal 214;

the third metal 203, the sixth metal 206 and the ninth metal 209 are connected with the seventeenth metal 217; the seventh metal 207, the eighth metal 208 and the fourteenth metal 214 are connected with the twentieth metal 220; the tenth metal 210 and the eleventh metal 211 are connected with the eighteenth metal 218; the twelfth metal 212 and the thirteenth metal 213 are connected with the nineteenth metal 219;

the first metal 201 and the second metal 202 are connected with the fifteenth metal 215, and a first electrode 301 is led out from the fifteenth metal 215, and used as a metal anode of the device (conducted forward) or a metal cathode (conducted reversely);

the fourth metal 204 and the fifth metal 205 are connected with the sixteenth metal 216; a second electrode 302 is led out from the sixteenth metal 216, and used as a metal cathode of the device (conducted forward) or a metal anode (conducted reversely).

In the second N well region 106, a mask preparing plate is used to insert a plurality of P wells at intervals; the circumference of each P well is isolated by the N well; different quantities of diodes are prepared to form a diode string which assists a departure path to effectively suppress the Darlington effect.

When the first electrode 301 is used as the metal anode of the device and the second electrode 302 is used as the metal cathode of the device, the first N+ implantation region 114 and the first P well 103, the first N well 104 and the second P well 105, the second N well 106 and the fourth P+ implantation region 119 respectively form reverse bias PN junctions, wherein the reverse bias PN junction formed by the first N well 104 and the second P well 105 is an avalanche breakdown junction of the SCR, and the diode formed by the well splitting assists the trigger path in conducting, thereby reducing the trigger voltage and turn-on time of the device;

when the first electrode 301 is used as the metal cathode of the device and the second electrode 302 is used as the metal anode of the device, the third N+ implantation region 118 and the second P well 105, the first N well 104 and the second P+ implantation region 115, the first N well 104 and the first P+ well 103 respectively form reverse bias PN junctions, wherein the reverse bias PN junction formed by the first N well 104 and the first P well 103 is an avalanche breakdown junction of the SCR, and the diode formed by the well splitting assists the trigger path in conducting, thereby reducing the trigger voltage and turn-on time of the device;

the trigger voltage can be controlled by increasing or decreasing the number of the diodes formed by well splitting to ensure the wide application of the device in a low voltage field.

When the first electrode 301 is used as the metal anode of the device and the second electrode 302 is used as the metal cathode of the device, the second P+ implantation region 115, the first N well 104 and the second P well 105 form a parasitic PNP tube T1; the first N well 104, the second P well 105 and the third N+ implantation region 118 form a parasitic NPN tube T2; the PNP tube T1 and the NPN tube T2 form a current discharge path of the SCR structure; when the first electrode 301 is used as the metal cathode of the device and the second electrode 302 is used as the metal anode of the device, the fourth P+ implantation region 119, the second N well 106, the deep N well 102, the first N well 104 and the first P well 103 form a parasitic PNP tube T1; the second N well 106, the deep N well 102, the first N well 104, the first P well 103 and the first N+ implantation region 114 form a parasitic NPN tube T2; and the PNP tube T1 and the NPN tube T2 form a current discharge path of the SCR structure.

The invention claimed is:

1. An ESD protection device for bidirectional diode string triggering SCR structure, comprising:
   a diode string formed by a well splitting technique,
   a bidirectional SCR structure; and
   a metal wire,
   wherein the bidirectional SCR structure and the diode string comprise a P substrate, a deep N well, a first P well, a first N well, a second P well, a second N well, a first P+ implantation region, a first N+ implantation region, a second P+ implantation region, a second N+ implantation region, a third P+ implantation region, a third N+ implantation region, a fourth P+ implantation region and a fourth N+ implantation region, wherein the deep N well is arranged on the P substrate, and the first P well, the first N well, the second P well and the second N well are successively arranged from left to right on a surface region of the deep N well; the left edge of the first P well is connected with the left edge of the deep N well; the right side of the first P well is connected with the left side of the first N well; the right side of the first N well is connected with the left side of the second P well; the right edge of the second P well is connected with the left side of the second N well; the right edge of the second N well is connected with the right edge of the deep N well; the first P+ implantation region and the first N+ implantation region are successively arranged from left to right on the surface region of the first P well; the second P+ implantation region and the second N+ implantation region are successively arranged from left to right on the surface region of the first N well; the third P+ implantation region and the third N+ implantation region are successively arranged from left to right on the surface region of the second P well; the fourth P+ implantation region and the fourth N+ implantation region are successively arranged from left to right on the surface region of the second N well,
   wherein, in the second N well region, a mask preparing plate is used to insert a plurality of P wells at intervals; the circumference of each P well is isolated by the N well; different quantities of diodes are prepared to form a diode string which assists a departure path to effectively suppress the Darlington effect; the surface region of each P well is respectively provided with a pair of P+ implantation region and N+ implantation region; trigger voltage is controlled by increasing or decreasing the number of diodes formed by well splitting,
   wherein the metal wire is used to connect the implantation region, and lead out two electrodes from the metal wire respectively as the forward conduction and reverse conduction of the ESD protection device, to ensure that a diode formed by well splitting assists a trigger path in conducting, thereby reducing the trigger voltage and turn-on time of the ESD protection device,
   wherein when the ESD protection device is a bidirectional three-diode triggering SCR structure, in the second N well region, along the Z-axis direction of the ESD protection device, the third P well, the third N well, the fourth P well, the fourth N well, the fifth P well, the fifth N well and the sixth N well are successively inserted on the right side; the fifth P+ implantation region, the fifth N+ implantation region, the sixth P+ implantation region, the sixth N+ implantation region, the seventh P+ implantation region and the seventh N+ implantation region are respectively inserted into the P well,
   wherein the lower side of the second N well is connected with the lower side of the deep N well; the upper side of the second N well is connected with the lower side of the third P well; the upper side of the third P well is connected with the lower side of the third N well; the upper side of the third N well is connected with the lower side of the fourth P well; the upper side of the fourth P well is connected with the lower side of the fourth N well; the upper side of the fourth N well is connected with the lower side of the fifth P well; the upper side of the fifth P well is connected with the lower side of the fifth N well; the upper side of the fifth N well is connected with the upper side of the deep N well; the fifth P+ implantation region and the fifth N+ implantation region are successively arranged from bottom to top on the surface region of the third P well; the sixth P+ implantation region and the sixth N+ implantation region are successively arranged from bottom to top on the surface region of the fourth P well; the seventh P+ implantation region and the seventh N+ implantation region are successively arranged from bottom to top on the surface region of the fifth P well,
   wherein the first N+ implantation region is connected with first metal; the second P+ implantation region is connected with second metal; the second N+ implantation region is connected with third metal; the third N+ implantation region is connected with fourth metal; the fourth P+ implantation region is connected with fifth metal; the fourth N+ implantation region is connected with sixth metal; the first P+ implantation region is connected with seventh metal; the third P+ implantation region is connected with eighth metal; the fifth P+ implantation region is connected with ninth metal; the fifth N+ implantation region is connected with tenth metal; the sixth P+ implantation region is connected with eleventh metal; the sixth N+ implantation region is connected with twelfth metal; the seventh P+ implantation region is connected with thirteenth metal; the seventh N+ implantation region is connected with fourteenth metal,
   wherein the third metal, the sixth metal and the ninth metal are connected with the seventeenth metal; the seventh metal, the eighth metal and the fourteenth metal are connected with the twentieth metal; the tenth metal and the eleventh metal are connected with the eighteenth metal; the twelfth metal and the thirteenth metal are connected with the nineteenth metal, wherein the first metal and the second metal are connected with the fifteenth metal, and a first electrode is led out from the fifteenth metal, and used as a metal anode of the ESD protection device—conducted forward or a metal cathode—conducted reversely, wherein the fourth metal and the fifth metal are connected with the sixteenth metal; a second electrode is led out from the sixteenth metal, and used as a metal cathode of the ESD protection device—conducted forward or a metal anode—conducted reversely, wherein when the first electrode is used as the metal anode of the ESD protection device and the second electrode is used as the metal cathode of the ESD protection device, the first N+ implantation region and the first P well, the first N well and the second P well, the second N well and the fourth P+ implantation region respectively form reverse bias PN junctions, wherein the reverse bias PN junction formed by the first N well and the second P well is an avalanche breakdown junction of the SCR, and the diode formed by the well splitting assists the trigger path in conducting, thereby reducing the trigger voltage and turn-on time of the ESD protection device, wherein when the first electrode is used as the metal cathode of the ESD protection device and the second electrode is used as the metal anode of the ESD protection device, the third N+ implantation region and the second P well, the first N well and the second P+ implantation region, the first N well and the first P+ well respectively form reverse bias PN junctions, and wherein the reverse bias PN junction formed by the first N well and the first P well is an avalanche breakdown junction of the SCR, and the diode formed by the well splitting assists the trigger path in conducting, thereby reducing the trigger voltage and turn-on time of the ESD protection device.

2. The ESD protection device according to claim 1, wherein when the first electrode is used as the metal anode of the ESD protection device and the second electrode is used as the metal cathode of the ESD protection device, the second P+ implantation region, the first N well and the second P well form a parasitic PNP tube T1; the first N well, the second P well and the third N+ implantation region form a parasitic NPN tube T2; the PNP tube T1 and the NPN tube T2 form a current discharge path of the SCR structure; when the first electrode is used as the metal cathode of the ESD protection device and the second electrode is used as the metal anode of the ESD protection device, the fourth P+ implantation region, the second N well, the deep N well, the first N well and the first P well form a parasitic PNP tube T1; the second N well, the deep N well, the first N well, the first P well and the first N+ implantation region form a parasitic NPN tube T2; and the PNP tube T1 and the NPN tube T2 form a current discharge path of the SCR structure.

* * * * *